United States Patent
Nakaie et al.

(10) Patent No.: US 8,829,972 B2
(45) Date of Patent: Sep. 9, 2014

(54) INTEGRAL VALUE MEASURING CIRCUIT

(75) Inventors: Toshiyuki Nakaie, Wakayama (JP); Joji Kayano, Wakayama (JP)

(73) Assignee: Hanwa Electronic Ind. Co., Ltd., Wakayama (JP)

( * ) Notice: Subject to any disclaimer, the term of this patent is extended or adjusted under 35 U.S.C. 154(b) by 325 days.

(21) Appl. No.: 13/542,999

(22) Filed: Jul. 6, 2012

(65) Prior Publication Data

US 2013/0009628 A1 Jan. 10, 2013

(30) Foreign Application Priority Data

Jul. 7, 2011 (JP) ................................ 2011-003898

(51) Int. Cl.
  *G06F 7/64* (2006.01)
  *G01R 22/08* (2006.01)
  *G01R 19/00* (2006.01)

(52) U.S. Cl.
  CPC ............ *G01R 22/08* (2013.01); *G01R 19/0023* (2013.01)
  USPC ........................................................ 327/336

(58) Field of Classification Search
  USPC ................................................. 327/334, 336
  See application file for complete search history.

(56) References Cited

U.S. PATENT DOCUMENTS 7,180,357 B2 * 2/2007 Van Tuijl ........................ 327/345
8,373,487 B1 * 2/2013 Roger ............................. 327/336

FOREIGN PATENT DOCUMENTS

JP 1-106962 U 7/1989

* cited by examiner

*Primary Examiner* — Hai L Nguyen
(74) *Attorney, Agent, or Firm* — Richard M. Goldberg

(57) ABSTRACT

An integral value measuring circuit includes an operational amplifier and a capacitor connected between input and output sides thereof, an electric potential of an output terminal where a predetermined resistance element connected to an output side of the operational amplifier is being zero, positive and negative DC voltage generating circuits which comprise positive and negative power sources, respectively, at the output side of the operational amplifier, the positive and negative DC voltage generating circuits and being connected to positive and negative power terminals, respectively, of the operational amplifier through switches, and a connection line between the negative power terminal and one switch and a connection line between the positive power terminal and another switch being connected to the positive and negative power terminals, respectively, of the operational amplifier through cross resistance elements having resistance values negligible compared to a leakage resistance value of the switches.

3 Claims, 1 Drawing Sheet

US 8,829,972 B2

INTEGRAL VALUE MEASURING CIRCUIT

FIELD OF THE INVENTION

The present invention relates to an integral value measuring circuit using an operational amplifier and a capacitor.

BACKGROUND OF THE INVENTION

In an integral value measuring circuit including a capacitor and an operational amplifier, the capacitor is connected between input and output sides of the operational amplifier as illustrated in FIG. 3.

In the circuit illustrated in FIG. 3, the following relationship is established:

$$i = Cp(V_o - V_i'),$$

where $V_i$ denotes an input voltage to the operational amplifier, $V_i'$ denotes a voltage of the negative input terminal of the operational amplifier, $V_o$ denotes an output voltage, R denotes a resistance value of the input side, C denotes a capacitance of the capacitor, i denotes an input current value in the operational amplifier, and p denotes a differentiation operator.

Meanwhile, considering $(V_i' - V_i) = iR$, $$i = Cp(V_o - R_i - V_i).$$

On the other hand $V_o = -AV_i' = -A(iR + V_i)$ wherein A denotes the degree of amplification of amplifier 1 in FIG. 3.

So, this leads to the following equation by deleting i $$V_o = -V_i/(CRp + CRp/A - 1/A) \approx -(V_i/CRp) = -(1/CR)\int_0^t v_i \, dt$$

because the value of A is far larger than 1.

That is, since the voltage $V_o$ in the output side of the operational amplifier is proportional to the integral value of the input voltage $V_i$, it is possible to measure the integral value of the input voltage $V_i$.

In the case of the integral value measurement circuit in prior art, as illustrated in FIG. 3, a switch is provided in parallel between both electrode sides of the capacitor. The capacitor is charged by turning on or off the separate switch SW, so that an integral state is formed as indicated by the aforementioned Equation 1.

However, a leakage resistance element and a parasitic capacitance are formed when the separate switch SW changes from the ON state to the OFF state, so that a noise current flows by itself. Therefore, it is difficult to obtain a simple integral equation in the aforementioned Equation 1.

The aforementioned difficulty will be described based on numerical formulas. Since the leakage resistance and the parasitic capacitance are connected in series (this fact is apparent because the noise current decays exponentially when the switch changes from the ON state to the OFF state), the following relationship is established between the input voltage $V_i$ of the operational amplifier and the output voltage $V_o$:

$$V_i/R \approx -\{Cp + 1/(r + 1/c'p)\}V_o = -\{Cp + c'p/(1 + c'rp)\}V_o$$

where r denotes the leakage resistance value of the capacitor, and c' denotes the parasitic capacitance value. Furthermore, this fact may become apparent from the following complicated differentiation and integral formulas:

$$V_o \approx -(1 + c'rp)V_i/R \cdot (Cp + c'p + Cc'rp^2)$$

[Non-patent Literature 1] "Practical Electronic Circuit Design Guide," Takashi KENJO, et al, published by SOGO Electronic Publication Corporation in Japan, April 1981

SUMMARY OF THE INVENTION

Problems to be Solved by the Invention

Thus, a need exists for a configuration of the integral value measuring circuit operated with a switch without influence of a leakage resistance and a parasitic capacitance of the switch.

Solutions to Problems

In order to address the problems described above, according to an aspect of the disclosure, there is provided an integral value measuring circuit including an operational amplifier and a capacitor connected between an input side and an output side of the operational amplifier, wherein an electric potential of an output terminal where a predetermined resistance element is connected to an output side of the operational amplifier is set to zero, a positive power source and a negative power source are provided for a voltage amplification circuit of the operational amplifier, a positive DC voltage generating circuit and a negative DC voltage generating circuit are provided for the positive power source and the negative power source, respectively, in an outer side of the operational amplifier, the positive DC voltage generating circuit and the negative DC voltage generating circuit are connected to a positive power terminal and a negative power terminal, respectively, of the operational amplifier through each switch and are connected to the output terminal of the operational amplifier, and a connection line between the positive power terminal and the switch of the positive DC voltage generating circuit side and a connection line between the negative power terminal and the switch of the negative DC voltage generating circuit side are connected to each other through two cross resistance elements having a resistance value negligible compared to a leakage resistance value of each switch while the two cross resistance elements do not make contact with each other.

DESCRIPTION OF SYMBOLS 1 operational amplifier
2 voltmeter

DETAILED DESCRIPTIONS OF THE INVENTION

Figure 1:
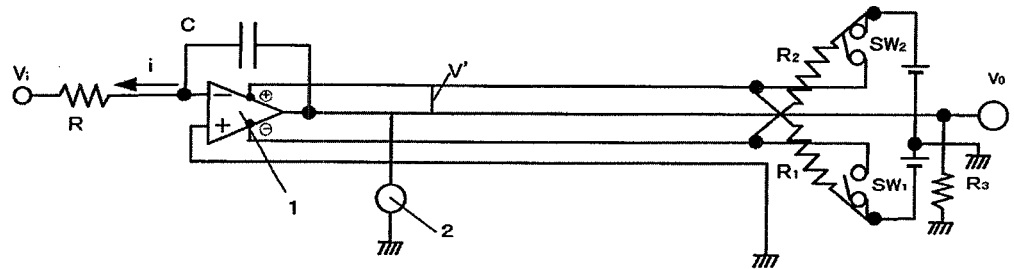
FIG. 1 A circuit diagram illustrating an embodiment of the present invention.

FIG. 1 illustrates an embodiment of the basic configuration described above, in which an output terminal is connected to the ground through a resistance element connected to the output side of the operational amplifier 1.

It is noted that a configuration for setting an electric potential of the output terminal to zero using the resistance element may employ, for example, a bridge circuit including four resistance elements, in which an equilibrium state is set (resistance elements $R_a$ and $R_b$ and resistance elements $R_c$ and $R_d$ are connected to each other to obtain a state $R_a \cdot R_d = R_b \cdot R_c$), and electric potentials of the connection lines on the nodes of two resistance elements that are not connected to the power source (a node between resistance elements $R_a$ and $R_b$, and a node between resistance elements $R_c$ and $R_d$) are set to zero at all times by setting the input power voltage to zero.

As apparent from FIG. 1, in the integral value measuring circuit disclosed herein, the switch is not connected to the capacitor in parallel, but the switches are provided between the positive power terminal of the operational amplifier 1 and a positive DC (Direct Current) voltage generating circuit and between the negative power terminal of the operational amplifier 1 and a negative DC voltage generating circuit.

In addition, when each switch changes from the OFF state to the ON state, a voltage is applied from the positive DC voltage generating circuit to the positive power terminal, and a voltage is applied from the negative DC voltage generating circuit to the negative power terminal, so that an amplification function of the operational amplifier 1 is exerted, and further, a capacitor provided between the input and output sides of the operational amplifier 1 is charged.

Although a battery is illustrated in FIG. 1 as the DC voltage generating circuit, it is not intended to limit the circuit to the battery. For example, a constant voltage generating circuit capable of converting an AC voltage to a DC voltage may be employed if necessary.

It would be apparent from the following description that there is no influence of the leakage resistance and the parasitic capacitance when each switch changes from the OFF state to the ON state.

In the circuit of FIG. 1, the following relationship is established:

$$2E = i'(R_1 + r_2),$$

where $R_1$ and $R_2$ denote resistance values of the resistance elements connected to the connection line of the negative power terminal and the connection line of the positive power terminal, respectively, in the operational amplifier 1 without connecting the connection lines to each other. $r_1$ and $r_2$ denotes resistance values of the switches $SW_1$ and $SW_2$, respectively, connected to the negative DC voltage generating circuit and the positive DC voltage generating circuit, respectively, when the switches $SW_1$ and $SW_2$ are turned on. E denotes a voltage generated in each DC voltage generating circuit. i' denotes a current flowing through a closed loop circuit including the resistance element $R_1$, two DC voltage generating circuits, and the switch $SW_2$.

Since an internal resistance of the operational amplifier 1 is significantly small when the switches $SW_1$ and $SW_2$ change from the OFF state to the ON state, the current flowing through the two DC voltage generating circuits can be regarded as being equal to the current i'.

Figure 3:
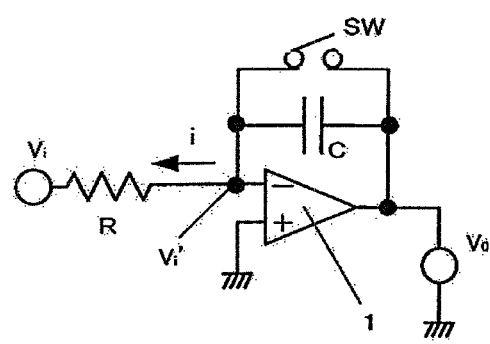
FIG. 3 A circuit diagram illustrating an integral value measuring circuit in prior art.

In addition, since a parasitic capacitance is not generated in the switches $SW_1$ and $SW_2$ in most cases when the switches $SW_1$ and $SW_2$ change from the OFF state to the ON state as described above, a parasitic capacitance generated when the switches change from the ON state to the OFF state can be neglected as illustrated in FIG. 3.

In this case, the electric potential of the positive power terminal in the operational amplifier 1, that is, the electric potential V' of the line including the resistance element $R_1$, the positive power terminal, and the switch $SW_2$ can be computed as follows.

[Equation 2]

$$V' = E - i' r_2 = E(R_1 - r_2)/(R_1 + r_2) \quad (2)$$

In the Equation 2 described above, since the resistance value $r_2$ when the switch $SW_2$ is turned on is small enough to neglect the resistance element $R_1$, the following relationship can be obtained:

$$V' \approx E.$$

Since the capacitor C connected between the positive power terminal and the negative input terminal of the operational amplifier 1 in FIG. 3 is not charged when the switches $SW_1$ and $SW_2$ are turned on, it can be said that the electric potential of the negative input terminal and the electric potential V' of the positive power terminal are approximately equal to each other.

Through a similar consideration, the electric potential of the negative power terminal in the operational amplifier 1 can be regarded as -E.

In this manner, while the amplified power voltage of the operational amplifier 1 is not influenced from the resistances $r_1$ and $r_2$ when the switches $SW_1$ and $SW_2$ are turned on, it is possible to measure an integral value of the input current $V_i$ based on the integral formula of the aforementioned Equation 1 due to the charging of the capacitor generated by the amplification of the operational amplifier 1 by changing the switches $SW_1$ and $SW_2$ from the OFF state to the ON state.

When the switches $SW_1$ and $SW_2$ change from the ON state to the OFF state, an inverted voltage is supplied to the positive power terminal and the negative power terminal of the operational amplifier 1 through the resistance elements $R_1$ and $R_2$ unlike a typical operational state, and there are a lot of short-circuited portions in an internal circuit. In addition, an inverted current is generated unlike a typical operational state in which the current flows from the negative power terminal to the positive power terminal. Therefore, the input voltage to the capacitor can be regarded as zero. In addition, the discharged current from the capacitor C flows through the internal side of the operational amplifier 1, so that a reset state, that is, a state that the charged electric charges are discharged, can be implemented.

Example

Hereinafter, an example of the disclosure will be described.

Figure 2:
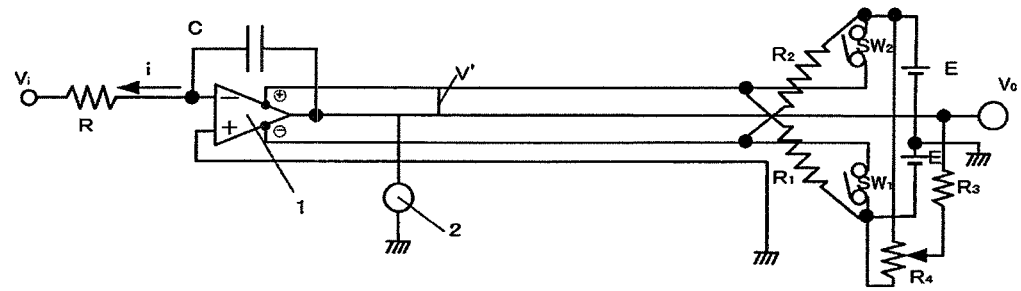
FIG. 2 A circuit diagram illustrating an example of the present invention.

In this example, the positive electrode side of the DC voltage generating circuit and the negative electrode side of the negative DC voltage generating circuit are connected to each other through a variable resistance element $R_4$ capable of changing both the resistance values using a slidable element as illustrated in FIG. 2. Meanwhile, the resistance element $R_3$ connected to the output side of the operational amplifier 1 is connected to the slidable element.

In a case where the output terminal of the operational amplifier 1 is connected to the ground through a predetermined resistance element $R_3$ as described in the embodiment of FIG. 1, the input voltage $V_i$ of the operational amplifier 1 may not be set to zero in some cases due to a slight variation in the parasitic capacitance, the leakage resistance, and the like between the positive electrode side circuit and the negative electrode side circuit while the switches $SW_1$ and $SW_2$ are turned off even when the voltages generated by each DC voltage generating circuit are set to be equal.

In this example, the resistance element $R_3$ in the output side of the operational amplifier 1 is slidably connected to the variable resistance element $R_4$. Therefore, the electric potential of the output terminal in the resistance element $R_3$ can be accurately set to the same value as that of the voltage $V_i$ by changing each of the resistance values in the positive DC voltage generating circuit side and the negative DC voltage generating circuit side. Therefore, the capacitor C can be reliably set to a reset state.

Effects of the Invention

Using the basic configuration described above, according to this disclosure, it is possible to form an integral value measuring circuit capable of accurately reflecting the integral value of the input voltage $V_i$ using the output voltage $V_o$ of the operational amplifier by changing the switch from the OFF state to the ON state.

This disclosure can be employed in a variety of electronic fields where the integral value measuring circuit element is necessary.

What is claimed is:

1. An integral value measuring circuit comprising:
   an operational amplifier,
   a capacitor connected between an input side and an output side of the operational amplifier,
   wherein an electric potential of an output terminal where a predetermined resistance element is connected to an output side of the operational amplifier is set to zero,
   a positive DC voltage generating circuit and a negative DC voltage generating circuit which comprise a positive power source and a negative power source are provided for the positive power source and the negative power source, respectively, at the output side of the operational amplifier,
   the positive DC voltage generating circuit and the negative DC voltage generating circuit are connected to a positive power terminal and a negative power terminal, respectively, of the operational amplifier through a switch and are connected to the output terminal of the operational amplifier, and
   a connection line between the negative power terminal and the switch of the negative DC voltage generating circuit side being connected to the positive power terminal of the operational amplifier through a cross resistance element having a resistance value negligible compared to a leakage resistance value of the first switch, and
   a connection line between the positive power terminal and the switch of the positive DC voltage generating circuit side being connected to the negative power terminal of the operational amplifier through a cross resistance element having a resistance value negligible compared to a leakage resistance value of each switch.

2. The integral value measuring circuit according to claim 1, wherein an output terminal of the resistance element connected to the output side of the operational amplifier is grounded.

3. The integral value measuring circuit according to claim 1, wherein a positive electrode side of the DC voltage generating circuit and a negative electrode side of the negative DC voltage generating circuit are connected to each other through a variable resistance element capable of changing resistance values of both the positive electrode side and negative electrode side using a slidable element, and the resistance element connected to the output side of the operational amplifier is connected to the slidable element.

* * * * *